US009905475B2

(12) United States Patent
Leobandung

(10) Patent No.: US 9,905,475 B2
(45) Date of Patent: Feb. 27, 2018

(54) SELF-ALIGNED HARD MASK FOR EPITAXY PROTECTION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 14 days.

(21) Appl. No.: 14/734,538

(22) Filed: Jun. 9, 2015

(65) Prior Publication Data

US 2016/0365287 A1    Dec. 15, 2016

(51) Int. Cl.
*H01L 21/8234* (2006.01)
*H01L 21/8238* (2006.01)
(Continued)

(52) U.S. Cl.
CPC ............ *H01L 21/823814* (2013.01); *H01L 21/76224* (2013.01); *H01L 21/823878* (2013.01);
(Continued)

(58) Field of Classification Search
CPC ..... H01L 21/823418; H01L 21/823814; H01L 29/66575; H01L 29/7834; H01L 29/7848; H01L 21/823468; H01L 21/823864; H01L 29/6656
See application file for complete search history.

(56) References Cited

U.S. PATENT DOCUMENTS 5,073,516 A * 12/1991 Moslehi ............ H01L 21/76294
148/DIG. 26
5,451,532 A *  9/1995 Bashir ................. H01L 21/8249
148/DIG. 10
(Continued)

FOREIGN PATENT DOCUMENTS

KR    1020110057853 A    6/2011
TW       200910591 A    3/2009

OTHER PUBLICATIONS

H. Kakiuchi et al., "Formation of Silicon Dioxide Layer at Low Temperatures (150-400° C.) by Atmospheric Pressure Plasma Oxidation of Silicon," Science and Technology of Advanced Materials, Apr. 2007, pp. 137-141, vol. 8, No. 3.

*Primary Examiner* — Davienne Monbleau
*Assistant Examiner* — Leslie Pilar Cruz
(74) *Attorney, Agent, or Firm* — Louis J. Percello; Ryan, Mason & Lewis, LLP

(57) ABSTRACT

A method includes isolating a first and at least a second region on a semiconductor substrate, and forming one or more devices on each of the first and at least second regions. Forming the one or more devices includes forming at least one gate structures in each of the first and at least second regions on a first surface of the substrate, depositing a spacer over the gate structures in each of the first and the at least second regions and over the first surface of the substrate, etching horizontal portions of the spacer in the first region, growing epitaxial portions in the first region in alignment with said at least one gate structure in the first region, oxidizing exposed surfaces of the epitaxial portions in the first region, and repeating the etching, growing and oxidizing steps for the at least second region.

17 Claims, 3 Drawing Sheets

(51) Int. Cl.
*H01L 29/66* (2006.01)
*H01L 21/762* (2006.01)
*H01L 29/417* (2006.01)
*H01L 27/092* (2006.01)
*H01L 29/06* (2006.01)

(52) U.S. Cl.
CPC ........ *H01L 27/092* (2013.01); *H01L 29/0649* (2013.01); *H01L 29/41783* (2013.01); *H01L 29/6653* (2013.01); *H01L 29/66636* (2013.01)

(56) References Cited

U.S. PATENT DOCUMENTS

| | | | |
|---|---|---|---|
| 6,190,976 B1* | 2/2001 | Shishiguchi | H01L 29/41783 257/E21.438 |
| 6,316,320 B1* | 11/2001 | Nakahata | H01L 21/02238 257/E21.166 |
| 6,686,248 B1 | 2/2004 | Yu | |
| 8,546,228 B2 | 10/2013 | Doris et al. | |
| 8,853,040 B2 | 10/2014 | Cheng et al. | |
| 8,860,138 B2 | 10/2014 | Doris et al. | |
| 2011/0070701 A1* | 3/2011 | Ning | H01L 21/823807 438/199 |
| 2011/0309446 A1 | 12/2011 | Doris et al. | |
| 2012/0241868 A1* | 9/2012 | Tsai | H01L 21/823807 257/369 |
| 2013/0330887 A1 | 12/2013 | Cheng et al. | |
| 2014/0248761 A1* | 9/2014 | Park | H01L 21/823871 438/586 |

\* cited by examiner

300

400

500

600

SELF-ALIGNED HARD MASK FOR EPITAXY PROTECTION

BACKGROUND

Complementary metal-oxide semiconductor (CMOS) is a technology for constructing various types of circuits. CMOS circuits may use a combination of p-type and n-type metal-oxide-semiconductor field-effect transistors (MOSFETs) to implement logic gates and other digital circuits. CMOS technology is used in various applications, including but not limited to microprocessors, microcontrollers, static RAM, etc.

SUMMARY

Embodiments described herein provide methods of forming semiconductor devices. For example, a method includes isolating a first and at least a second region on a semiconductor substrate, and forming one or more devices on each of the first and at least second regions. Forming at least one gate structures in each of the first and at least second regions on a first surface of the substrate, depositing a spacer over the gate structures in each of the first and the at least second regions and over the first surface of the substrate, etching horizontal portions of the spacer in the first region, growing epitaxial portions in the first region in alignment with said at least one gate structure in the first region, oxidizing exposed surfaces of the epitaxial portions in the first region, and repeating the etching, growing and oxidizing steps for the at least second region.

These and other features, objects and advantages of the present invention will become apparent from the following detailed description of illustrative embodiments thereof, which is to be read in connection with the accompanying drawings.

DETAILED DESCRIPTION

The present application relates to the field of semiconductor device manufacturing and, more particularly, to forming a plurality of field-effect transistors (FETs) using one spacer deposition.

Illustrative embodiments will be described herein with reference to particular methods and apparatus. It is to be appreciated, however, that the invention is not limited to the specific methods and apparatus illustratively shown and described herein. Rather, embodiments of the invention are directed more broadly to techniques for generating FETs on a substrate using a single spacer deposition. Moreover, it will become apparent to those skilled in the art given the teachings herein that numerous modifications can be made to the embodiments shown that are within the scope of the present invention. That is, no limitations with respect to the specific embodiments described herein are intended or should be inferred. For example, the figures show planar MOSFET devices, but the invention can also be applied to other MOSFET such as FINFET, Nanowire, or bipolar junction devices (BJT).

Modern CMOS processes require multiple epitaxy steps for each of the various different types of devices formed such as N-channel FETs (NFETs), P-channel FETs (PFETs), low leakage devices such as embedded dynamic random-access memory (eDRAM), analog devices, etc. Formation of such devices, however, can be complicated and impractical. For example, the different devices may utilize different types of epi, requiring first depositing a spacer followed by an etch process for each of the different types of epi. Such techniques, however, suffer from various disadvantages. For example, such techniques introduce multiple spacer thicknesses and/or widths. In addition, each spacer deposition and etch procedure erodes the shallow trench insulation (STI) regions as well as the gate hard mask and device layers. As such, these methods are complicated and impractical.

Embodiments provide a process for creating self-aligned post epi hard mask in order to do multiple epi with a single spacer deposition, thus creating a self-aligned post epi hard mask such that multiple types of epi can be grown utilizing a single spacer deposition and one etch process per device. Embodiments provide for a semiconductor structure comprising multiple FETs on a substrate formed with a single spacer deposition and a method of making thereof.

An illustrative embodiment for forming multiple FETs on a substrate using a single spacer deposition will be described below with reference to FIGS. 1-6. Each of the structures 100 to 600 illustrate steps which may be used in the process of forming multiple FETs on a substrate using only a single spacer deposition.

Figure 1:
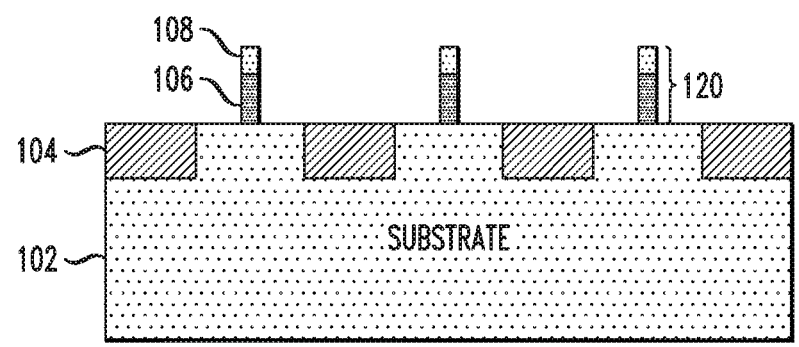
FIG. 1 illustrates a side view of a silicon substrate having multiple gates formed thereon, a gate hard mask formed on each gate, and the gates separated from each other by STI embedded in the substrate, according to an embodiment of the invention.

FIG. 1 is a side view, illustrating formation of the semiconductor structure 100, which includes a substrate 102, shallow trench isolation (STI) regions 104, and a plurality of gate structures 120, each gate structure 120 comprising a gate 106 and a gate hard mask (HM) 108 deposited thereon. The gate HM 108 may be formed from oxide, nitride or any suitable material. Suitable STI insulators may be, for example, one or more dielectric materials such as silicon dioxide, silicon boron nitride, silicon nitride or other insulator.

Figure 2:
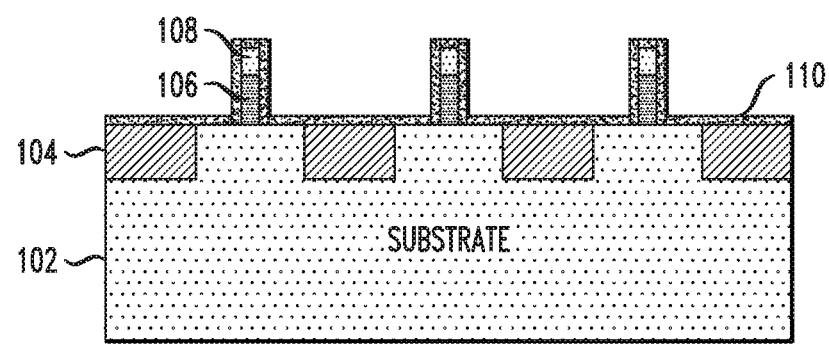
FIG. 2 illustrates a side view of the structure of FIG. 1 after a spacer is deposited over the gate and hard mask structures, and over the surface of the silicon substrate and STIs, according to an embodiment of the invention.

FIG. 2 depicts a side view of the next step in forming the semiconductor device. As shown, a spacer 110 is deposited over the gate structures 120, the surface of substrate 102 and the surface of the STIs 104 in the regions where the plurality of FETs are to be formed, resulting in structure 200. Spacer 110 may be of any suitable thickness, for example, ranging from 5 nm-20 nm. The spacer 110 may be formed from suitable materials, such as, nitride or oxide.

Figure 3:
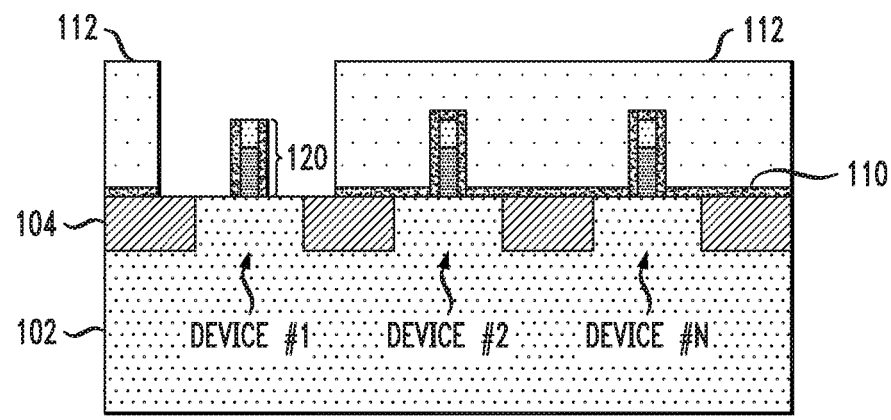
FIG. 3 illustrates a side view of the device of FIG. 2 after patterning a resist mask and etching the spacer in a first device region, according to an embodiment of the invention.

As shown in FIG. 3, which depicts a side view of structure 300, a resist mask 112 is patterned for the first device (device #1). The region of device #1 is etched using, for example, a reactive ion etch (RIE) which removes the horizontally disposed portions of spacer material 110 on the top of the gate structure 120 and from the surface of the substrate 102 and STI 104, leaving vertical sidewall spacers adjacent the gate structure 120. While FIG. 3 shows one device being etched in a first region, it is to be understood that more than one device may be etched in one or more regions such that one RIE is performed for each type of devices (e.g., one RIE for p-type devices, and/or one RIE for n-type devices). Advantageously, only one spacer deposition is required for the structure as a whole, and only one RIE is required for each type of device in the structure.

In the following step, as shown in the side view of structure 400 in FIG. 4, the resist mask is removed and epi 116 is grown in and above substrate 102 between each side of gate structure 120 and STI regions 104, thereby forming source/drain regions for device #1.

Figure 5:
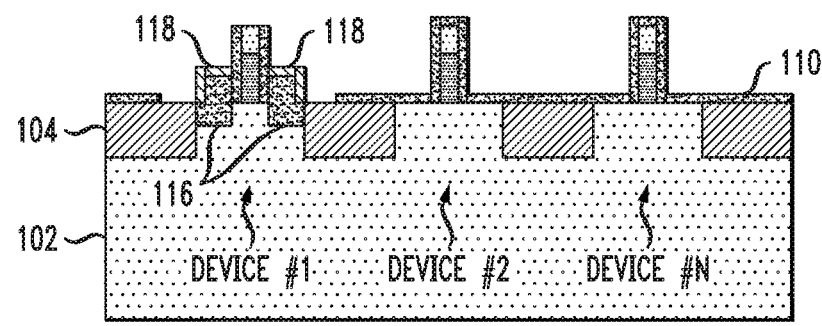
FIG. 5 illustrates a side view of the device of FIG. 4 after an oxide film is grown on the epi surface in the first device region, according to an embodiment of the invention.
Figure 6:
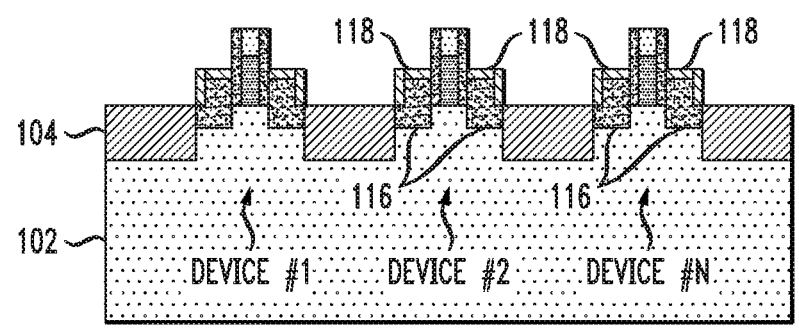
FIG. 6 illustrates a side view of the device of FIG. 5 after repeating the steps of FIGS. 3-5 for each of the remaining device region 2 to region N, according to an embodiment of the invention.

In the next step, as shown in the side view of structure 500 in FIG. 5, a HM 118 is formed by growing an oxide film on the surface of epi 116 to prevent further epi growth when growing epi for devices 2 to N. The oxidized HM 118 is formed for example, using a low temperature plasma oxidation process which helps prevent damage to epi 116. The HM 118 may be formed by oxidizing material 116 in an oxygen ambient or by nitridizing in a nitrogen containing ambient.

Figure 4:
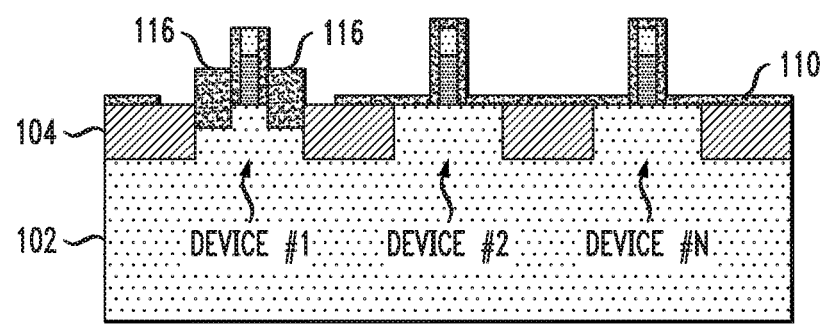
FIG. 4 illustrates a side view of the device of FIG. 3 after removal of the resist mask, and growing epi for the source/drain in the first device region, according to an embodiment of the invention.

Subsequently, the processing steps shown in FIGS. 3-5 are repeated to form device #2 through device #N. An illustrative embodiment is shown in the side view of structure 600 in FIG. 6, structure 600 comprising device #1, device #2 and Device #N formed according to the process detailed in FIGS. 3-5 above. By way of example, the structure 600 shows devices 1, 2 and N of different types. Device #1 may be, by way of example, a PFET device while device #2 is an NFET device and device #N is an eDRAM device. In addition, as discussed above, more than one device of a given type may be formed. As an example, device #1 and device #N may be PFET devices while device #2 may be an NFET device. The epi material for the eDRAM may be different from that of the NFET device and PFET device (e.g., different dopant). Various other types of devices and numbers of devices may be formed.

The process described above in the context of FIGS. 1-6 may also be used for fin devices, silicon on insulator (SOI) devices and bulk devices. For example, to form a fin device according to an embodiment of the invention, the epitaxy may be grown around the fin device.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
   isolating at least a first region and a second region on a semiconductor substrate; and
   forming one or more devices on each of the first and second regions, comprising:
      forming at least one gate structure in each of the first and second regions on a first surface of the substrate;
      depositing a spacer over the gate structures in the first and second regions and over the first surface of the substrate;
      etching horizontal portions of the spacer in the first region while leaving the spacer deposited in the second region, wherein vertical portions of the spacer in the first region are left in place after etching;
   growing epitaxial portions in the first region in alignment with said at least one gate structure in the first region;
      forming an oxide film on the epitaxial portions in the first region by oxidizing exposed surfaces of the epitaxial portions in the first region; and
      repeating the etching, growing and forming steps for the second region, wherein the oxide film formed on the epitaxial portions in the first region remains during the etching and growing steps for the second region, and further wherein the repeating etching step comprises etching horizontal portions of the spacer in the second region while leaving vertical portions of the spacer in place after etching.

2. The method of claim 1, wherein the spacer comprises a thickness ranging from 5nm to 20nm.

3. The method of claim 1, wherein the spacer comprises one of an oxide and a nitride.

4. The method of claim 1, wherein the first and second regions of the semiconductor substrate are isolated utilizing shallow trench isolation (STI).

5. The method of claim 1, wherein the gate structures comprise a hard mask deposited thereon.

6. The method of claim 5, wherein the hard mask comprises one of an oxide and a nitride.

7. The method of claim 1, wherein the etching step comprises performing a reactive ion etch (RIE).

8. The method of claim 1, wherein the grown epitaxial portions form one or more source/drain regions of the device.

9. The method of claim 8, wherein the epitaxial portions comprise p-doped epi.

10. The method of claim 8, wherein the epitaxial portions comprise n-doped epi.

11. The method of claim 1, wherein the exposed surfaces of the epitaxial portions are oxidized using low temperature plasma oxidation.

12. The method of claim 1, wherein the forming of the oxide film on the epitaxial portions in the first region prevents further epitaxial growth in the first region when growing epitaxial portions in the second region.

13. The method of claim 12, wherein the epitaxial portions formed in the first region are different than the epitaxial regions formed in the second region.

14. The method of claim 13, wherein the epitaxial portions formed in the first region comprise one of p-doped epi and n-doped epi.

15. The method of claim 14, wherein the epitaxial portions formed in the second region comprise one of p-doped epi and n-doped epi different from the epitaxial portions formed in the first region.

16. The method of claim 1, wherein the one or more devices formed on the first region comprise one of PFETs, NFETs and eDRAM.

17. The method of claim 16, wherein the one or more devices formed on the second region comprise a different one of PFETs, NFETs and eDRAM than the one or more devices formed on the first region.

\* \* \* \* \*